United States Patent
Kojima

(10) Patent No.: US 6,958,279 B2
(45) Date of Patent: Oct. 25, 2005

(54) METHOD FOR MANUFACTURING SEMICONDUCTOR DEVICE

(75) Inventor: Manabu Kojima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 50 days.

(21) Appl. No.: 10/642,158

(22) Filed: Aug. 18, 2003

(65) Prior Publication Data

US 2004/0038490 A1    Feb. 26, 2004

(30) Foreign Application Priority Data

Aug. 26, 2002  (JP)  .............................. 2002-245395

(51) Int. Cl.⁷ .......................................... H01L 21/336
(52) U.S. Cl. ...................... 438/299; 438/301; 438/306
(58) Field of Search ................................ 438/231, 197, 438/199, 229, 299, 301, 303, 305, 306, 307

(56) References Cited

U.S. PATENT DOCUMENTS 6,596,599 B1 *  7/2003  Guo ........................... 438/305
6,624,483 B2 *  9/2003  Kurata ....................... 257/387

* cited by examiner

*Primary Examiner*—Ha Nguyen
*Assistant Examiner*—Scott Geyer
(74) *Attorney, Agent, or Firm*—Westerman, Hattori, Daniels & Adrian, LLP

(57) ABSTRACT

A gate insulator film and a gate electrode are formed on a semiconductor substrate, and then a layered stack of a $SiO_2$ film and a SiN film is formed on the entire surface. Subsequently, sidewalls made of polysilicon film are formed adjacent to the gate electrode via the layered stack of the $SiO_2$ film and the SiN film. Then, using as a mask the gate electrode, portions of the layered stack adjacent to the gate electrode, and the sidewalls, an ion dopant is implanted into a device active region to thereby form source/drains therein, and the sidewalls are then removed. At this stage, since the gate insulator film is completely covered with the layered stack, the gate insulator film is not ablated or retreated even on a device isolation insulator film.

28 Claims, 10 Drawing Sheets

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2002-245395, filed on Aug. 26, 2002, the entire contents of which are incorporated herein by reference.

BACKGROUND OF THE INVENTION

1. Field of the Invention

The present invention relates to methods for manufacturing a semiconductor device such as a CMOS transistor, and more particularly to a method for manufacturing a semiconductor device suitable for designing micro-transistors in LSI manufacturing techniques.

2. Description of the Related Art

To manufacture a CMOS transistor, such a method has been employed which includes the step of forming extension layers, followed by the step of forming sources and drains and then an annealing step for activating implanted ion dopant. However, by this method, it is difficult to sufficiently activate the sources, the drains, and the gates while providing abrupt extension layers with reduced overlaps therebetween.

In this context, studies have been recently made on a method for carrying out two-step annealing in the art. According to this method, the step of forming sources and drains is first carried out, followed by the step of rapid high-temperature annealing, thereby activating implanted dopants. The subsequent step of forming extension layers is performed, followed by the step of lower temperature annealing than the first annealing, thereby activating the implanted dopants again. This ensures a sufficient activation in the sources, the drains, and the gates as well as abruptness of the extension layers.

Now, the method of carrying out the two-step annealing is explained with reference to the attached drawings. FIG. 8 is a view illustrating the layout of a transistor. FIGS. 9A and 9B to FIGS. 12A and 12B are cross-sectional views of a semiconductor device in various stages of manufacture shown in the order in which they appear in the prior art method. FIGS. 9A, 10A, 11A, and 12A are cross-sectional views taken along the line III—III in FIG. 8, while FIGS. 9B, 10B, 11B, and 12B are cross-sectional views taken along the line IV—IV in FIG. 8.

In this prior art manufacturing method, as shown in FIG. 9A, STI (Shallow Trench Isolation) is employed to selectively form a device isolation insulator film 22 on a semiconductor substrate 21. Then, as shown in FIGS. 9A and 9B, a gate insulator film 23 and a gate electrode 24 are formed within a device active region defined by the device isolation insulator film 22 such that their both ends extend onto the device isolation insulator film 22. Thereafter, a $SiO_2$ film is formed on the entire surface and etch-backed by anisotropic etching, thereby forming sidewalls 25. Then, using as a mask the gate electrode 24 and the sidewalls 25, an ion dopant is implanted into the device active region, thereby forming a source 26S and a drain 26D therein, as shown in FIG. 9B. Then, an annealing step is carried out to activate the implanted ion dopant.

Then, as shown in FIGS. 10A and 10B, the sidewalls 25 are removed.

Then, as shown in FIGS. 11A and 11B, a $SiO_2$ film 27 and a SiN film 28 are sequentially formed on the entire surface.

Thereafter, as shown in FIGS. 12A and 12B, the layered stack of the $SiO_2$ film 27 and the SiN film 28 is etch-backed, thereby forming an offset film 29. Then, as shown in FIG. 12B, using as a mask the offset film 29 and the gate electrode 24, an ion dopant is implanted into the device active region, thereby forming extension layers 30 so as to overlap the source 26S and the drain 26D. Then, an annealing step is carried out to activate the implanted ion dopant.

As shown in FIGS. 10A and 10B, in the method for manufacturing a semiconductor device by employing the aforementioned two-step annealing, the sidewalls 25 are removed after the source 26S and the drain 26D have been formed. The sidewalls 25 are removed typically by means of wet treatment. At this stage, in the device active region, since the gate insulator film 23 is formed on the semiconductor substrate 21, the insulator film itself very thin in thickness is thus less prone to being retreated. On the other hand, on the device isolation insulator film 22, the gate insulator film 23 extends onto the device isolation insulator film 22, where the thickness of the insulator film is the sum of the thickness of the gate insulator film 23 and that of the device isolation insulator film 22. Thus, the gate insulator film 23 and the device isolation insulator film 22 are apt to retreat. As shown in FIG. 10A, a small amount of the surface of the device isolation insulator film 22 is stripped away and the dimensions of the gate insulator film 23 are reduced. Consequently, in the design rules for gates of about 100 nm or less in length, problems will rise with the gate electrode 24 on the gate insulator film 23 such as toppling, deformation, or peeling.

Furthermore, in the aforementioned prior art manufacturing method, notches are formed between the offset film 29 and the semiconductor substrate 21 to form the extension layers 30. This causes the gate insulator film 23 to be easily retreated upon forming the notches, thereby further reducing the dimensions of the gate insulator film 23 as shown in FIG. 12A. Thus, the aforementioned problems become further noticeable.

SUMMARY OF THE INVENTION

The present invention was developed in view of the aforementioned problems. It is therefore an object of the present invention to provide a method for manufacturing a semiconductor device by which a good extension layer can be formed while preventing peeling or the like of the gate electrode.

The inventor has made intensive studies and consequently reached the following inventive aspects.

In a method for manufacturing a semiconductor device according to a first aspect of the present invention, a gate insulator film and a gate electrode are formed on a semiconductor substrate, a layered stack including two or more insulator films having etching rates different from one another is formed, and then a mask sidewall is formed adjacent to the gate electrode via the layered stack. The mask sidewall has an etching rate different from that of the outermost film among the insulator films in the layered stack. After these steps, a first ion dopant is implanted into the semiconductor substrate using the gate electrode, portions of the layered stack adjacent to the gate electrode, and the mask sidewall as a mask, and then the mask sidewall is removed. Thereafter, anisotropic etching on an entire surface of the layered stack, thereby allowing part of the layered stack to remain only on a side of the gate electrode, and then a second ion dopant of the same conductivity type as that of the first ion dopant is implanted into the semiconductor substrate using the gate electrode and the layered stack as a mask, thereby forming a dopant diffusion layer.

In a method for manufacturing a semiconductor device according to a second aspect of the present invention, a gate insulator film and a gate electrode are formed on a semiconductor substrate, a mask sidewall is formed adjacent to the gate electrode, a first ion dopant is implanted into the semiconductor substrate using the gate electrode and the mask sidewall as a mask, and then the mask is removed sidewall. After these steps, a layered stack is formed adjacent to the gate electrode. The layered stack includes two or more insulator films having etching rates different from one another. Thereafter, a second ion dopant of the same conductivity type as that of the first ion dopant is implanted into the semiconductor substrate using the gate electrode and the layered stack as a mask, thereby forming a dopant diffusion layer. In the method, the step of forming the layered stack is carried out between the step of forming the gate insulator film and the gate electrode and the step of forming the mask sidewall. And in the step of removing the mask sidewall, only the mask sidewall is removed while protecting the gate insulator film using the layered stack.

According to various aspects of the present invention, it is possible to protect the gate insulator film using the layered stack upon removing the mask sidewall. Accordingly, even when the extension layer is formed after the source/drain has been formed, problems with the gate electrode such as peeling can be avoided. Furthermore, the layered stack itself is conventionally provided to form an extension layer, thereby resulting in no increase in the number of the processes.

DETAILED DESCRIPTION OF THE PREFERRED EMBODIMENTS

Figure 1:
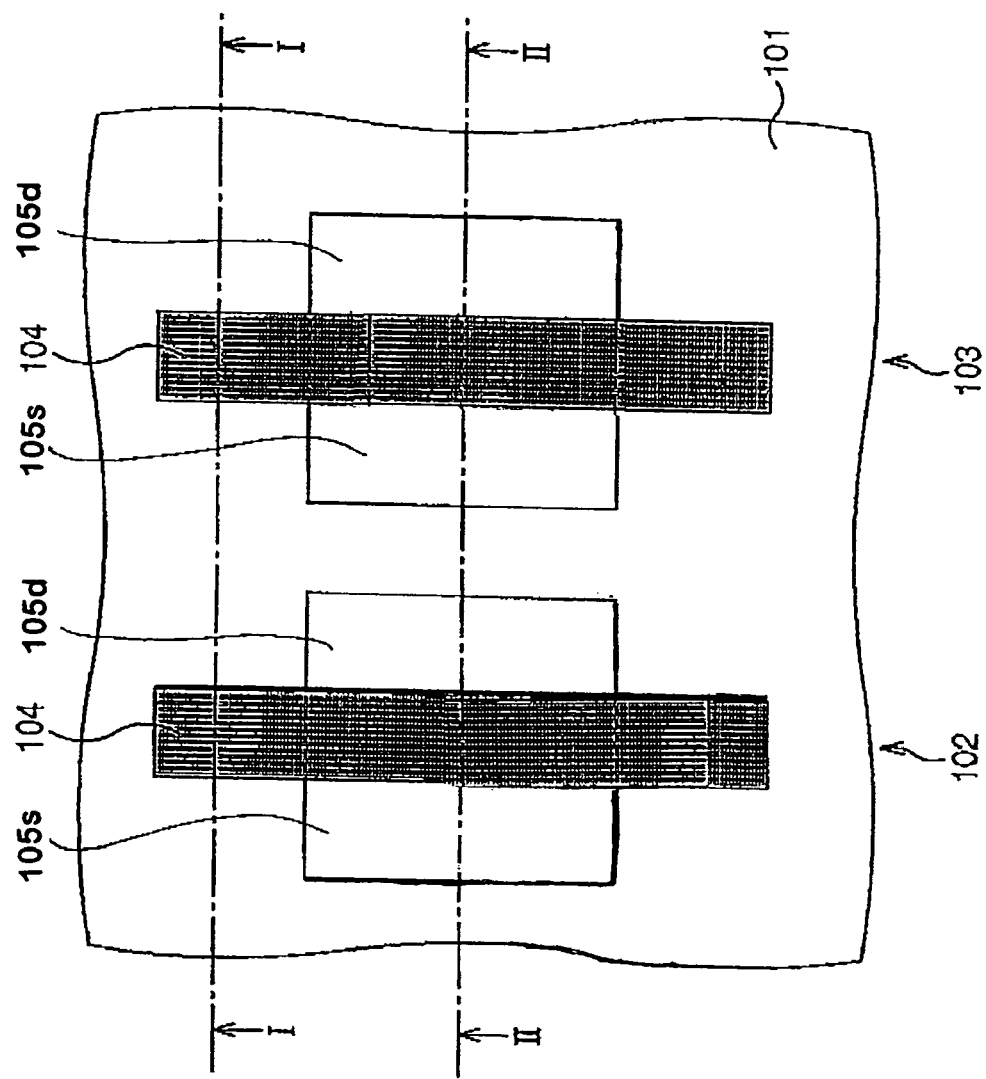
FIG. 1 is a view illustrating the layout of a CMOS transistor to be manufactured by a method according to an embodiment of the present invention.

Now, a method for manufacturing a semiconductor device according to an embodiment of the present invention will be described more specifically with reference to the accompanying drawings. FIG. 1 is a view illustrating the layout of a CMOS transistor manufactured by the method according to the embodiment of the present invention. FIGS. 2A and 2B to FIGS. 7A and 7B are cross-sectional views of a semiconductor device in various stages of manufacture shown in the order in which they appear in the method according to the embodiment of the present invention. FIGS. 2A, 3A, 4A, 5A, 6A, and 7A are cross-sectional views taken along the line I—I in FIG. 1, while FIGS. 2B, 3B, 4B, 5B, 6B, and 7B are cross-sectional views taken along the line II—II in FIG. 1.

As shown in FIG. 1, in the semiconductor device to be manufactured according to this embodiment, an nMOS 102 and a pMOS 103 are to be provided within a device region defined by a device isolation region 101. The nMOS 102 and the pMOS 103 are each to be provided with a gate 104, a source 105s and drain 105d. In this arrangement, the gate 104 extends beyond the boundary between the device region and the device isolation region 101 onto the device isolation region 101.

Figure 2A:
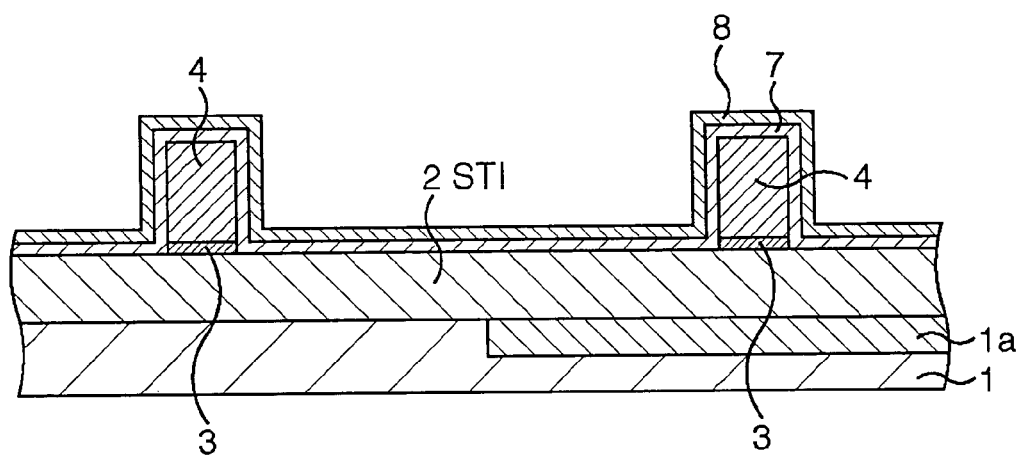
FIGS. 2A and 2B are cross-sectional views of a semiconductor device in a stage of fabrication in the method according to the embodiment of the present invention.
Figure 2B:
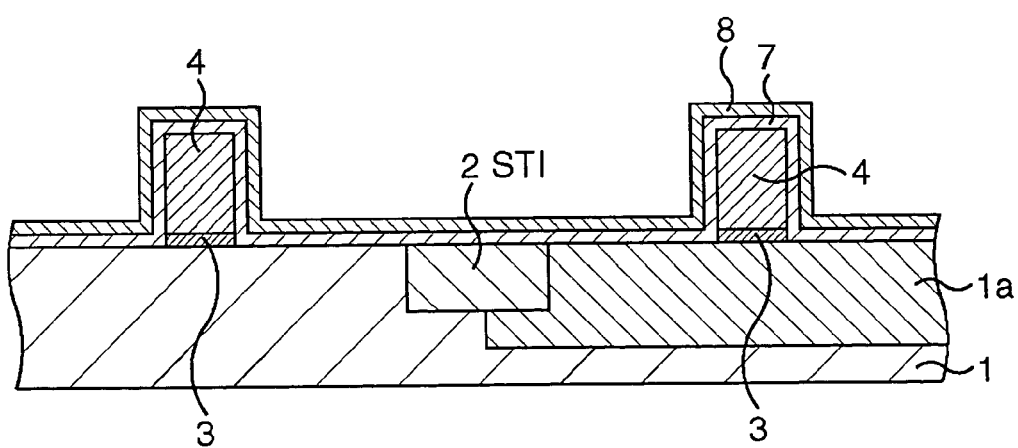

In this embodiment, as shown in FIGS. 2A and 2B, an n-type well 1a is first formed selectively on a surface of a p-type semiconductor substrate 1, and a device isolation insulator films 2 are formed in device isolation regions such as a boundary between the n-type well 1a and the p-type semiconductor substrate 1. A method for forming the device isolation insulator film 2 may be, but not limited to, STI or LOCOS. Subsequently, a gate insulator film 3 and a gate electrode 4 are formed within a device active region defined by the device isolation insulator film 2, both ends of them extending onto the device isolation insulator film 2.

Thereafter, a $SiO_2$ film 7 and a SiN film 8 are sequentially formed on the entire surface. For example, the CVD technique is used to form the $SiO_2$ film 7 and the SiN film 8. The thicknesses of the $SiO_2$ film 7 and the SiN film 8 are preferably 10 nm or less, for example, about 8 nm but not limited thereto.

Figure 3A:
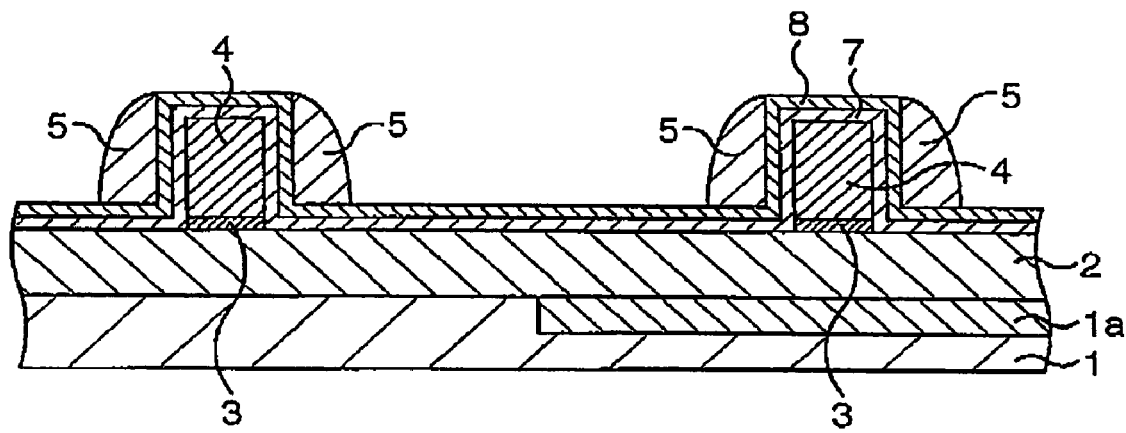
FIGS. 3A and 3B are cross-sectional views of a semiconductor device in the stage of fabrication next to that of FIGS. 2A and 2B in the method according to the embodiment of the present invention.
Figure 3B:
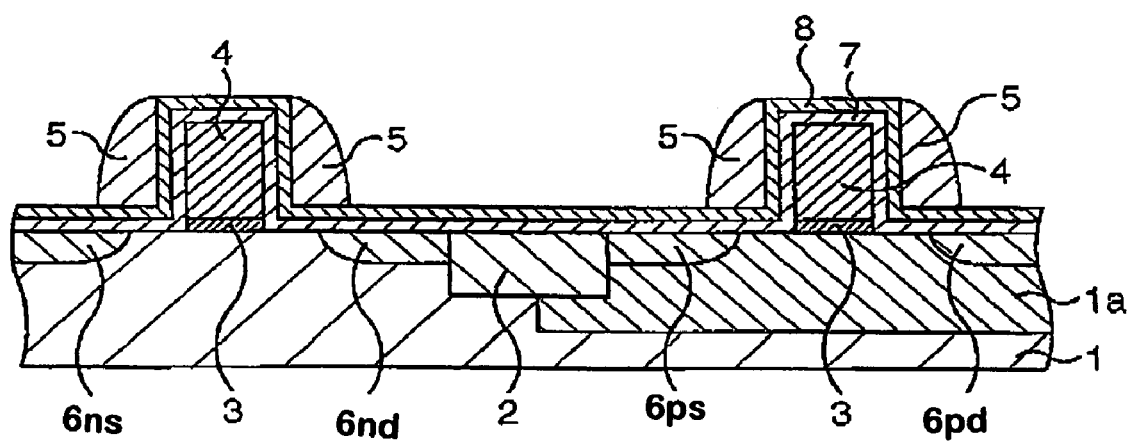

Subsequently, a polysilicon film is formed on the entire surface and then etch-backed by anisotropic etching, thereby forming sidewalls (mask sidewalls) 5 adjacent to the gate electrode 4 via the layered stack of the $SiO_2$ film 7 and the SiN film 8, as shown in FIGS. 3A and 3B.

Then, using a predetermined patterned resist layer (not shown), the gate electrodes 4, portions of the layered stack adjacent to the gate electrodes 4, and the sidewalls 5 as a mask, an ion dopant is implanted into the device active region, thereby forming sources 6ps and 6ns and drains 6pd and 6nd therein, as shown in FIG. 3B. At this stage, a p-type ion dopant such as boron is implanted into the n-type well 1a using a patterned resist layer covering the p-type semiconductor substrate 1, thereby forming the source 6ps and the drain 6*pd* therein. On the other hand, an n-type ion dopant such as phosphor is implanted into the p-type semiconductor substrate 1 using a patterned resist layer covering the n-type well 1*a*, thereby forming the source 6*ns* and the drain 6*nd* therein. Then, an annealing step is carried out to activate the implanted ion dopant.

Figure 4A:
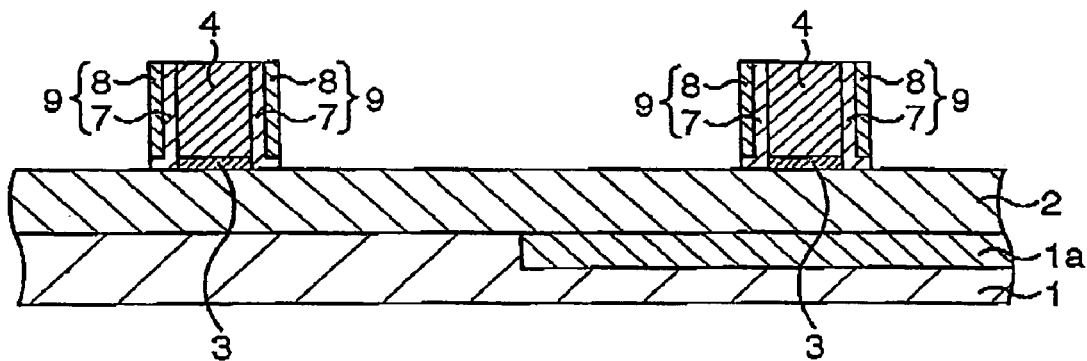
FIGS. 4A and 4B are cross-sectional views of a semiconductor device in the stage of fabrication next to that of FIGS. 3A and 3B in the method according to the embodiment of the present invention.
Figure 4B:
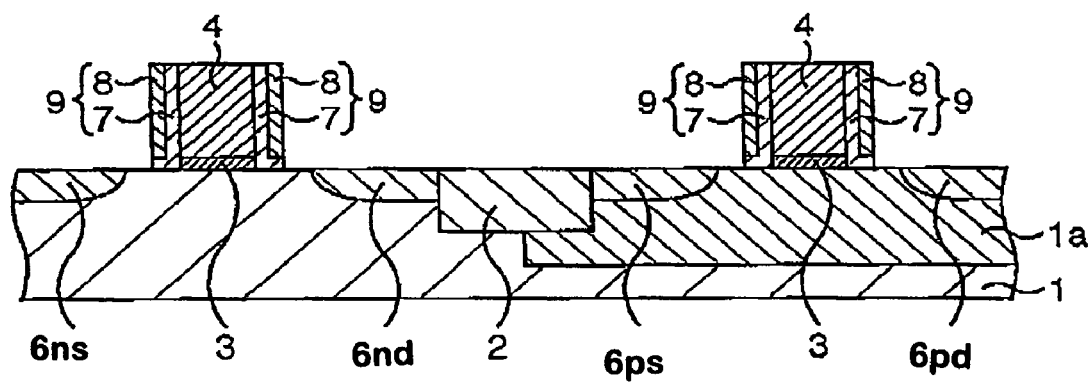

Subsequently, as shown in FIGS. 4A and 4B, the sidewalls 5*a* formed of polysilicon layers are selectively removed, for example, by isotropic etching. Additionally, the layered stack of the $SiO_2$ film 7 and the SiN film 8 is etch-backed by anisotropic etching, thereby forming an offset film 9 made up of the $SiO_2$ film 7 and the SiN film 8 adjacent to the gate electrode 4.

Figure 5A:
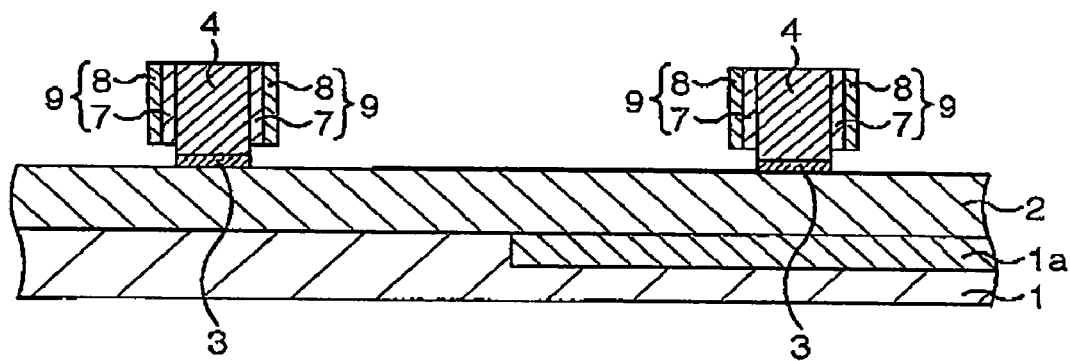
FIGS. 5A and 5B are cross-sectional views of a semiconductor device in the stage of fabrication next to that of FIGS. 4A and 4B in the method according to the embodiment of the present invention.
Figure 5B:
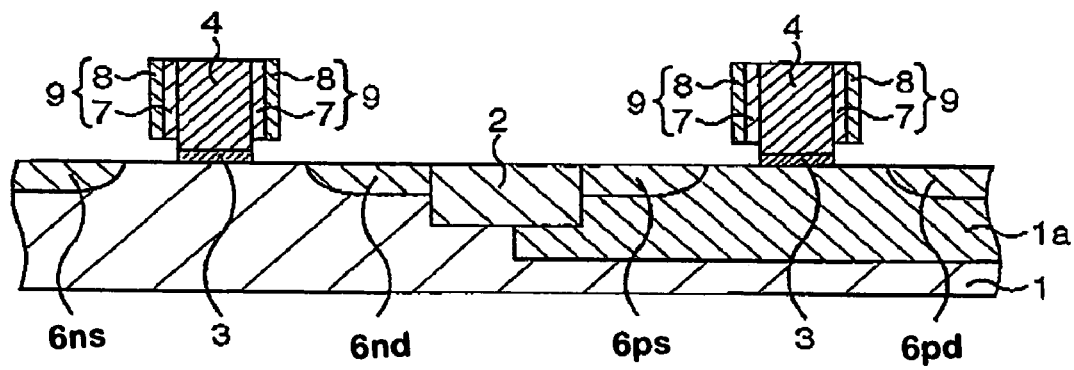

As shown in FIGS. 5A and 5B, a bottom portion of the $SiO_2$ film 7 is then removed by wet etching, thereby forming a notch at the bottom portion of the offset film 9.

Figure 6A:
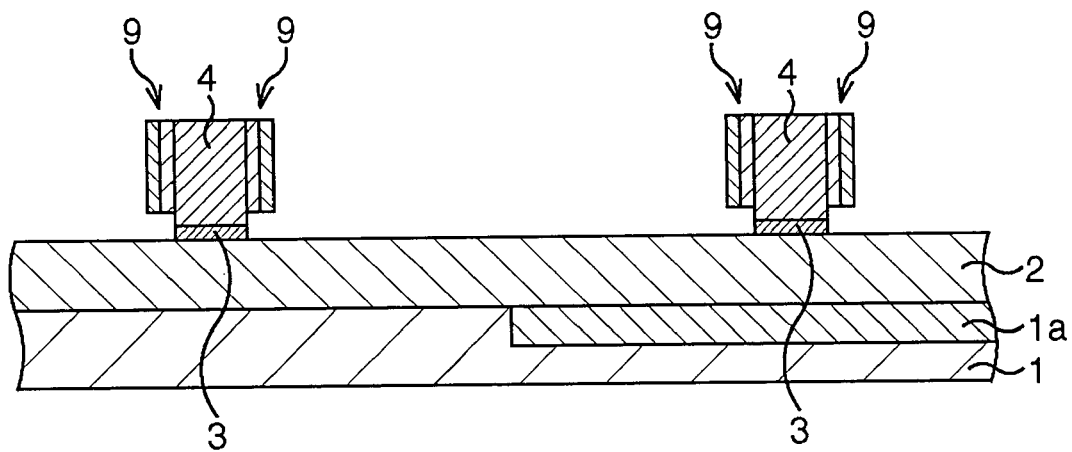
FIGS. 6A and 6B are cross-sectional views of a semiconductor device in the stage of fabrication next to that of FIGS. 5A and 5B in the method according to the embodiment of the present invention.
Figure 6B:
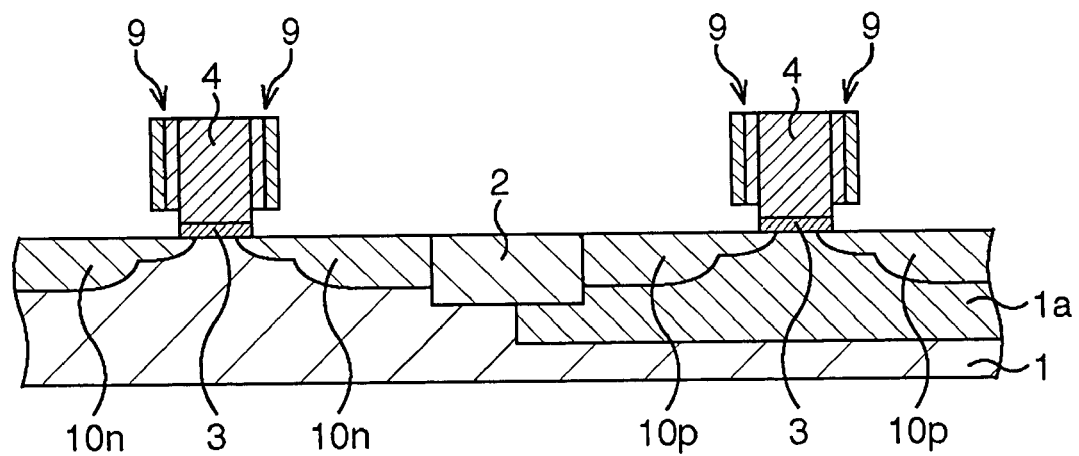

Then, ion dopants are implanted into the device active region using a predetermined patterned resist layer (not shown), the offset film (layered stack) 9, and the gate electrode 4 as a mask, thereby forming pocket layers and extension layers so as to overlap the sources 6*ps* and 6*ns* and drains 6*pd* and 6*nd*. At this stage, using a patterned resist layer covering the p-type semiconductor substrate 1, an n-type ion dopant such as arsenic is implanted into the n-type well 1*a*, thereby forming the pocket layers therein, while a p-type ion dopant such as boron is implanted, thereby forming the extension layers. As shown in FIG. 6B, dopant diffusion layers 10*p* are formed from the pocket layers, the extension layers, and the source 6*ps* and the drain 6*pd*. On the other hand, using a patterned resist layer covering the n-type well 1*a*, a p-type ion dopant such as boron is implanted into the p-type semiconductor substrate 1, thereby forming the pocket layers, while an n-type ion dopant such as arsenic is implanted, thereby forming the extension layers. As shown in FIG. 6B, dopant diffusion layers 10*n* are formed from the pocket layers, the extension layers, and the source 6*ns* and the drain 6*nd*. Then, an annealing step is carried out to activate the implanted ion dopants.

Figure 7A:
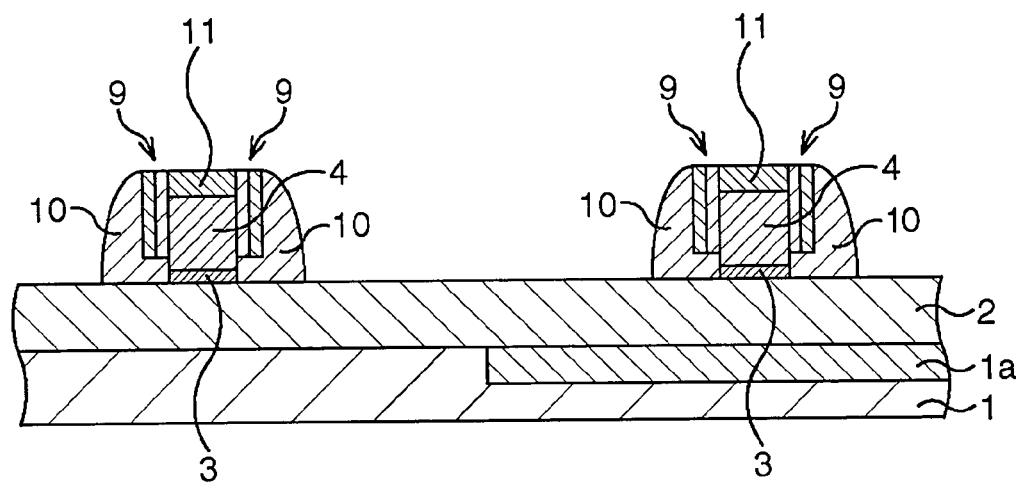
FIGS. 7A and 7B are cross-sectional views of a semiconductor device in the stage of fabrication next to that of FIGS. 6A and 6B in the method according to the embodiment of the present invention.
Figure 7B:
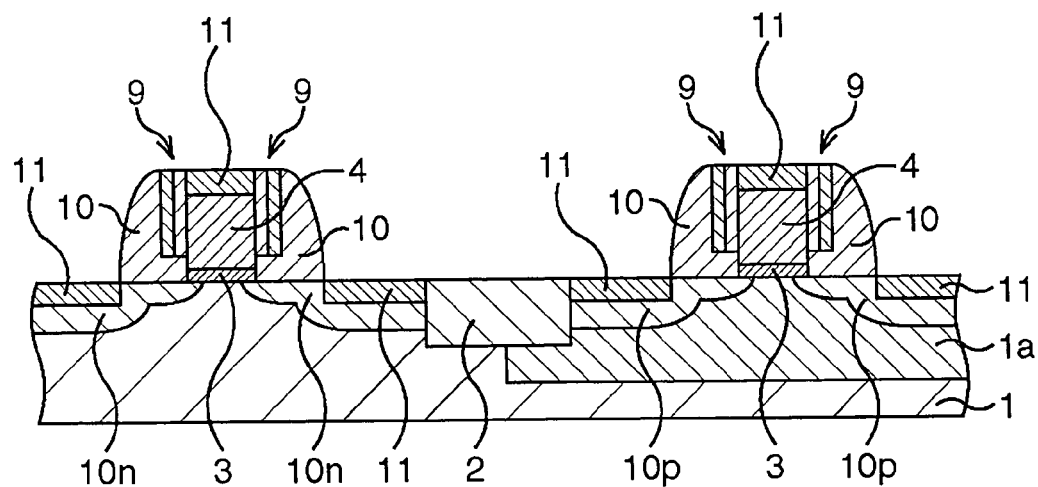
Figure 8:
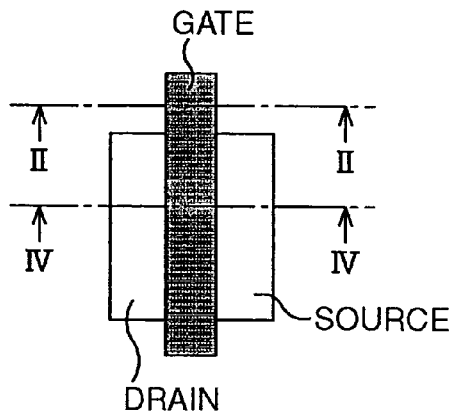
FIG. 8 is a view illustrating the layout of a transistor.
Figure 9A:
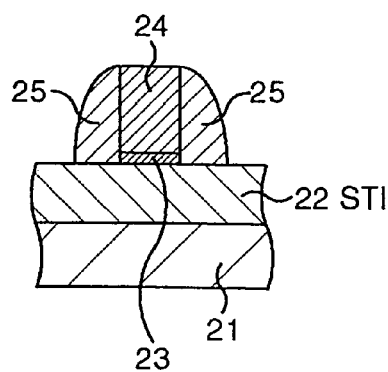
FIGS. 9A and 9B are cross-sectional views of a semiconductor device in a stage of fabrication in a prior art method.
Figure 9B:
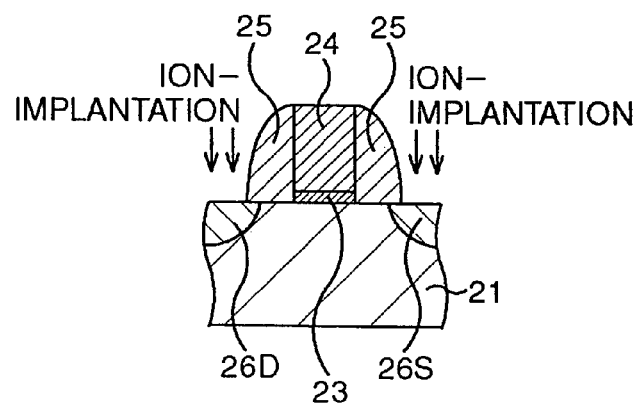
Figure 10A:
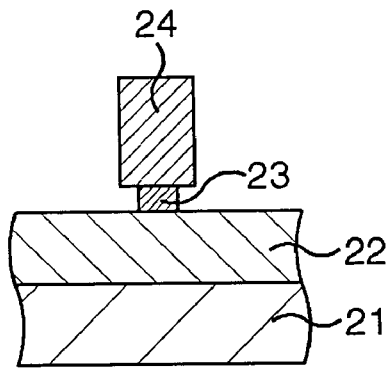
FIGS. 10A and 10B are cross-sectional views of a semiconductor device in the stage of fabrication next to that of FIGS. 9A and 9B in the prior art method.
Figure 10B:
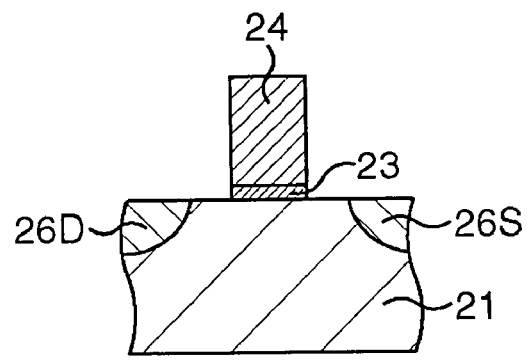
Figure 11A:
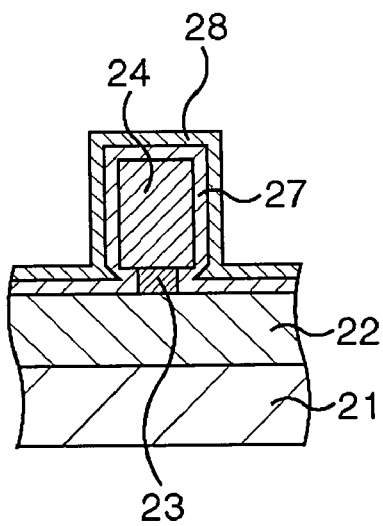
FIGS. 11A and 11B are cross-sectional views of a semiconductor device in the stage of fabrication next to that of FIGS. 10A and 10B in the prior art method.
Figure 11B:
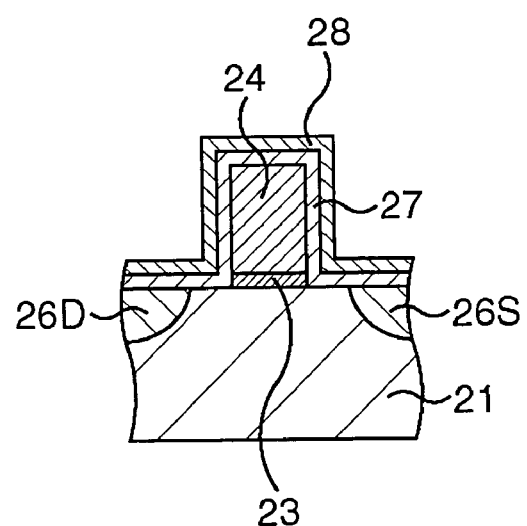
Figure 12A:
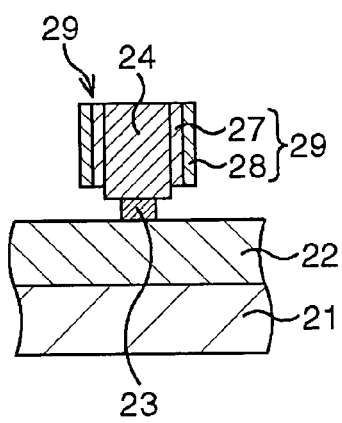
FIGS. 12A and 12B are cross-sectional views of a semiconductor device in the stage of fabrication next to that of FIGS. 11A and 11B in the prior art method.
Figure 12B:
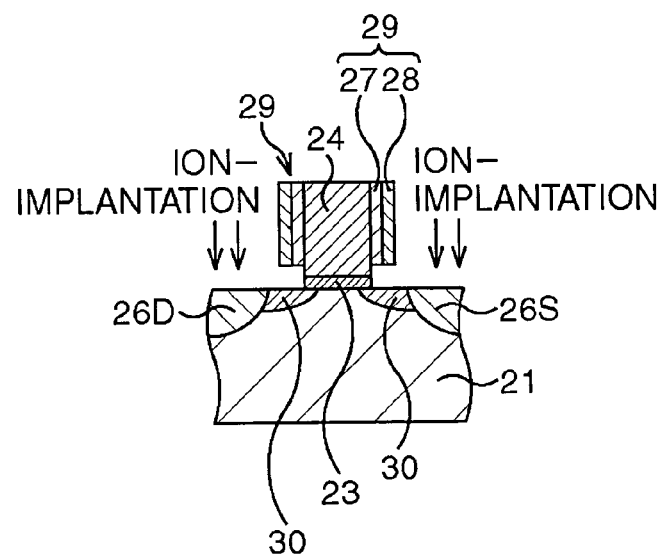

Subsequently, a $SiO_2$ film is formed on the entire surface and then etch-backed by anisotropic etching, thereby forming sidewalls (isolation sidewalls) 10, as shown in FIGS. 7A and 7B. For example, the thickness of the $SiO_2$ film is about 80 nm. Thereafter, a Co film (not shown) is deposited on the entire surface, for example, by sputtering. Then, RTA is carried out to form silicide layers by reacting the Co film with the gate electrode 4 and the dopant diffusion layers 10*p* and 10*n*, thereby forming a $CoSi_2$ film 11. At this stage, the sidewall 10 serves as a polysilicon isolation spacer between the gate electrode 4 and the dopant diffusion layers 10*p* or 10*n*. Thereafter, the non-reacted portion of the Co film is removed.

Thus, after the aforementioned silicidation or salicidation process is carried out, inter-layer insulator films are formed, and wirings are formed, thereby providing a completed CMOS transistor.

In this embodiment described above, upon removing the sidewalls 5 used as a mask to form the source/drains, the gate insulator film 3 is completely covered with the layered stack of the $SiO_2$ film 7 and the SiN film 8. The layered stack and the sidewalls 5 formed of polysilicon film are significantly different in etching rate from each other. This allows the layered stack to remain unchanged as well as the device isolation insulator film 2 and the gate insulator film 3 not to be ablated or retreated. Therefore, problems will never rise with the gate electrode 4 such as toppling, deformation, or peeling.

Furthermore, in this embodiment, the bottom portions of the $SiO_2$ film 7 are removed by wet etching to provide a notch to the layered stack. At this stage, the gate insulator film 3 and the device isolation insulator film 2 are exposed to the etchant; however, only a trace of the $SiO_2$ film 7 is removed. Thus, even when the device isolation insulator film 2 and the gate insulator film 3 have been ablated, only a trace thereof may be ablated, causing no problems with the gate electrode 4 such as toppling, deformation, or peeling.

Accordingly, while preventing problems with the gate such as peeling, it is possible to ensure the abruptness of the extension layers and provide a semiconductor device with good characteristics. This effect is particularly noticeable with a semiconductor device having a gate 100 nm in length.

Furthermore, since conventional manufacturing methods also have a step of forming the layered stack (the offset film 9) itself, there is no need for an additional step of forming it, thereby eliminating an increase in costs.

The material of the sidewalls used as a mask is not limited to polysilicon film but may be any one as long as it has an etching rate different from that of the outermost film of the layered stack. For example, it is also acceptable to use a sidewall formed of silicon dioxide film as a mask.

In this embodiment, it is preferable for the polysilicon film forming the sidewalls 5*a* to be implanted with a dopant and thereby provided with a stabilized type of conductivity. This is because of the following reason. That is, a polysilicon film implanted with no dopant is a mixture of the portions of p-type semiconductor, n-type semiconductor, and intrinsic semiconductor, which have etching rates different from one another. In contrast to this, a stabilized type of conductivity realized by dopant implantation makes it possible to suppress variations in etching rate, thereby allowing the etching to be carried out with stability.

It is also preferable to carry out annealing between the formation of the sources 6*ps* and 6*ns* and drains 6*pd* and 6*nd* and the removal of the sidewalls 5*a*. This is because of the following reason. That is, a relatively high dose of ion species is employed for the formation of the sources 6*ps* and 6*ns* and drains 6*pd* and 6*nd*, thereby making a transmitting layer or the layered stack of the $SiO_2$ film 7 and the SiN film 8 vulnerable to damage. This may result in an increase in etching rate and cause part of the layered stack to be stripped away upon removal of the sidewalls 5*a*, making the p-type semiconductor substrate 1 or the n-type well 1*a* vulnerable to damage. In contrast to this, the layered stack can be recovered from damage by carrying out the aforementioned annealing to prevent a rise in etching rate, thereby preventing damage to the p-type semiconductor substrate 1 and the n-type well 1*a*.

In the aforementioned embodiment, a notch is formed at the bottom portion of the offset film 9. However, without forming the notch, ion dopants may be implanted to form the pocket layers and the extension layers.

As described above, since the gate insulator film is completely covered with the layered stack, the present invention makes it possible to prevent the gate insulator film from being retreated upon removal of a mask sidewall. Therefore, problems will never rise with the gate electrode such as toppling, deformation, or peeling. Additionally, upon forming a notch in the layered stack, only a trace of the insulator films constituting the layered stack is removed. Thus, even when the gate insulator film has been ablated, only a trace thereof may be stripped away, thereby making it possible to prevent the problems with the gate electrode such as peeling. Accordingly, while preventing the problems with the gates such as peeling, it is possible to provide a semiconductor device with good characteristics. Furthermore, when compared with conventional manufacturing methods, the method according to the invention requires no additional step of forming the layered stack, thereby preventing an increase in the number of processes.

What is claimed is:

1. A method for manufacturing a semiconductor device comprising the steps of:
   forming a gate insulator film and a gate electrode on a semiconductor substrate,
   forming a layered stack including two or more insulator films having etching rates different from one another on an entire surface of said semiconductor substrate,
   forming a mask sidewall adjacent to said gate electrode via said layered stack, said mask sidewall having an etching rate different from an etching rate of the outermost film among said insulator films in said layered stack,
   implanting a first ion dopant into said semiconductor substrate using said gate electrode, portions of said layered stack adjacent to said gate electrode, and said mask sidewall as a mask,
   removing said mask sidewall,
   performing anisotropic etching on an entire surface of said layered stack, thereby allowing part of said layered stack to remain only on a side of said gate electrode, and
   implanting a second ion dopant of the same conductivity type as that of said first ion dopant into said semiconductor substrate using said gate electrode and said layered stack as a mask, thereby forming a dopant diffusion layer.

2. The method for manufacturing a semiconductor device according to claim 1, wherein
   the step of forming said layered stack includes the step of forming an oxide layer in contact with said gate electrode.

3. The method for manufacturing a semiconductor device according to claim 2, further comprising the step of performing wet etching on a bottom portion of said oxide layer to thereby form a notch at a bottom portion of said layered stack prior to the step of implanting said second ion dopant.

4. The method for manufacturing a semiconductor device according to claim 1, further comprising the step of forming a notch at a bottom portion of said layered stack between the step of performing said anisotropic etching and the step of implanting said second ion dopant.

5. The method for manufacturing a semiconductor device according to claim 1, further comprising the step of selectively forming a device isolation insulator film on a surface of said semiconductor substrate prior to the step of forming said gate insulator film and said gate electrode, wherein said gate insulator film and said gate electrode are formed so as to extend onto said device isolation insulator film.

6. The method for manufacturing a semiconductor device according to claim 1, wherein said outermost film is formed of a nitride film.

7. The method for manufacturing a semiconductor device according to claim 1, wherein said mask sidewall is formed of a polysilicon film.

8. The method for manufacturing a semiconductor device according to claim 7, wherein said polysilicon film is implanted with a dopant.

9. The method for manufacturing a semiconductor device according to claim 1, wherein said mask sidewall is formed of a silicon oxide film.

10. The method for manufacturing a semiconductor device according to claim 1, further comprising the step of performing annealing, between the step of implanting said first ion dopant and the step of removing said mask sidewall, to recover from damage to said layered stack caused upon implanting said first ion dopant.

11. The method for manufacturing a semiconductor device according to claim 1, further comprising the steps of performing annealing, after the step of implanting said first ion dopant and after the step of implanting said second ion dopant, to thereby activate the implanted ion dopants.

12. The method for manufacturing a semiconductor device according to claim 1, wherein the step of implanting said second ion dopant is followed by the steps of:
   forming an isolation sidewall adjacent to said gate electrode to isolate in an insulative manner said gate electrode and said dopant diffusion layer from each other, and
   forming a silicide layer on surfaces of said gate electrode and said dopant diffusion layer.

13. The method for manufacturing a semiconductor device according to claim 1, wherein said gate is 100 nm or less in length in the step of forming said gate insulator film and said gate electrode.

14. The method for manufacturing a semiconductor device according to claim 1, wherein upon forming said dopant diffusion layer, a third ion dopant is implanted into said semiconductor substrate in addition to said second ion dopant using said gate electrode and said layered stack as a mask, the third ion dopant being opposite in conductivity type to said first ion dopant.

15. A method for manufacturing a semiconductor device comprising the steps of:
   forming a gate insulator film and a gate electrode on a semiconductor substrate,
   forming a mask sidewall adjacent to said gate electrode,
   implanting a first ion dopant into said semiconductor substrate using said gate electrode and said mask sidewall as a mask,
   removing said mask sidewall,
   forming a layered stack adjacent to said gate electrode, the layered stack including two or more insulator films having etching rates different from one another, and
   implanting a second ion dopant of the same conductivity type as that of said first ion dopant into said semiconductor substrate using said gate electrode and said layered stack as a mask, thereby forming a dopant diffusion layer, wherein
   the step of forming said layered stack is carried out between the step of forming said gate insulator film and said gate electrode and the step of forming said mask sidewall, and
   in the step of removing said mask sidewall, only said mask sidewall is removed while protecting said gate insulator film using said layered stack.

16. The method for manufacturing a semiconductor device according to claim 15, wherein
   the step of forming said layered stack includes the step of forming an oxide layer in contact with said gate electrode.

17. The method for manufacturing a semiconductor device according to claim 16, further comprising the step of performing wet etching on a bottom portion of said oxide layer to thereby form a notch at a bottom portion of said layered stack prior to the step of implanting said second ion dopant.

18. The method for manufacturing a semiconductor device according to claim 15, further comprising the step of forming a notch at a bottom portion of said layered stack between the step of removing said mask sidewall and the step of implanting said second ion dopant.

19. The method for manufacturing a semiconductor device according to claim 15, further comprising the step of selectively forming a device isolation insulator film on a surface of said semiconductor substrate prior to the step of forming said gate insulator film and said gate electrode, wherein said gate insulator film and said gate electrode are formed so as to extend onto said device isolation insulator film.

20. The method for manufacturing a semiconductor device according to claim 15, wherein said outermost film is formed of a nitride film.

21. The method for manufacturing a semiconductor device according to claim 15, wherein said mask sidewall is formed of a polysilicon film.

22. The method for manufacturing a semiconductor device according to claim 21, wherein said polysilicon film is implanted with a dopant.

23. The method for manufacturing a semiconductor device according to claim 15, wherein said mask sidewall is formed of a silicon oxide film.

24. The method for manufacturing a semiconductor device according to claim 15, further comprising the step of performing annealing, between the step of implanting said first ion dopant and the step of removing said mask sidewall, to recover from damage to said layered stack caused upon implanting said first ion dopant.

25. The method for manufacturing a semiconductor device according to claim 15, further comprising the steps of performing annealing, after the step of implanting said first ion dopant and after the step of implanting said second ion dopant, to thereby activate the implanted ion dopants.

26. The method for manufacturing a semiconductor device according to claim 15, wherein the step of implanting said second ion dopant is followed by the steps of:

forming an isolation sidewall adjacent to said gate electrode to isolate in an insulative manner said gate electrode and said dopant diffusion layer from each other, and forming a silicide layer on surfaces of said gate electrode and said dopant diffusion layer.

27. The method for manufacturing a semiconductor device according to claim 15, wherein said gate is 100 nm or less in length in the step of forming said gate insulator film and said gate electrode.

28. The method for manufacturing a semiconductor device according to claim 15, wherein upon forming said dopant diffusion layer, a third ion dopant is implanted into said semiconductor substrate in addition to said second ion dopant using said gate electrode and said layered stack as a mask, the third ion dopant being opposite in conductivity type to said first ion dopant.

* * * * *